United States Patent
Cramer

(10) Patent No.: US 9,722,657 B2
(45) Date of Patent: *Aug. 1, 2017

(54) MOBILE ELECTRONIC DEVICE COVERING

(71) Applicant: Alliance Sports Group, L.P., Grand Prairie, TX (US)

(72) Inventor: Steven Cramer, Redmond, WA (US)

(73) Assignee: Alliance Sports Group, L.P., Grand Prairie, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/287,225

(22) Filed: Oct. 6, 2016

(65) Prior Publication Data

US 2017/0134065 A1 May 11, 2017

Related U.S. Application Data

(63) Continuation of application No. 14/880,071, filed on Oct. 9, 2015, now Pat. No. 9,467,190.

(60) Provisional application No. 62/151,559, filed on Apr. 23, 2015.

(51) Int. Cl.
*H04M 1/00* (2006.01)
*H04B 1/38* (2015.01)
*H04B 1/3888* (2015.01)

(52) U.S. Cl.
CPC .................. *H04B 1/3888* (2013.01)

(58) Field of Classification Search
None
See application file for complete search history.

(56) References Cited

U.S. PATENT DOCUMENTS

| | | | |
|---|---|---|---|
| 8,428,644 | B1 | 4/2013 | Harooni |
| 9,467,190 | B1 * | 10/2016 | Cramer ............... H04B 1/3888 |
| 2003/0095374 | A1 | 5/2003 | Richardson |
| 2009/0181729 | A1 | 7/2009 | Griffin, Jr. et al. |
| 2013/0301235 | A1 | 11/2013 | Harooni |
| 2015/0045012 | A1 | 2/2015 | Siminou |
| 2015/0311939 | A1 | 10/2015 | Zalon |

FOREIGN PATENT DOCUMENTS

| | | |
|---|---|---|
| CN | 103533115 | 1/2014 |
| CN | 103731525 | 4/2014 |
| CN | 103873614 | 6/2014 |
| JP | 2007/108302 | 4/2007 |

(Continued)

*Primary Examiner* — Erika Washington
(74) *Attorney, Agent, or Firm* — Thorpe North & Western LLP

(57) ABSTRACT

A protective covering configured for use with a mobile electronics device, including a front wall and a plurality of side walls defining a primary cavity. A back wall is disposed within the primary cavity separating the primary cavity into a protective covering electronics housing cavity and a mobile electronic device housing cavity. One or more apertures are disposed within the front wall. A light source is disposed within the protective covering electronics housing cavity, wherein at least a portion of the light source is disposed outside of the protective covering electronics housing cavity and through at least one of the one or more apertures in the front wall. A heat sink is disposed within the protective covering electronics housing cavity and in contact with the light source.

20 Claims, 13 Drawing Sheets

(56) References Cited

FOREIGN PATENT DOCUMENTS

| KR | 20080079057 | 8/2008 |
|----|-------------|--------|
| KR | 20120140328 | 12/2012 |
| WO | WO 2013/154857 | 10/2013 |
| WO | WO 2014/020362 | 2/2014 |
| WO | WO 2014/046362 | 3/2014 |

* cited by examiner

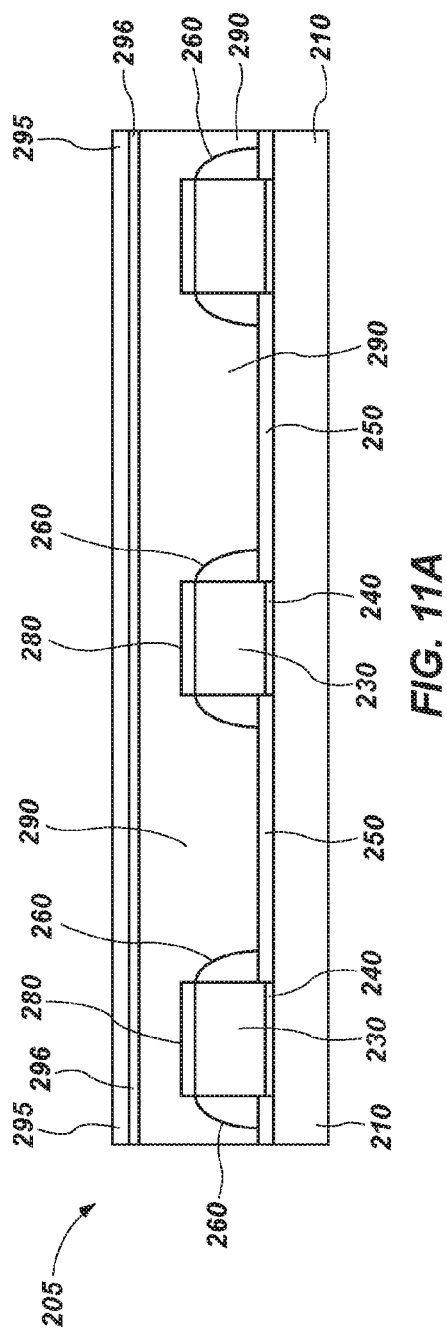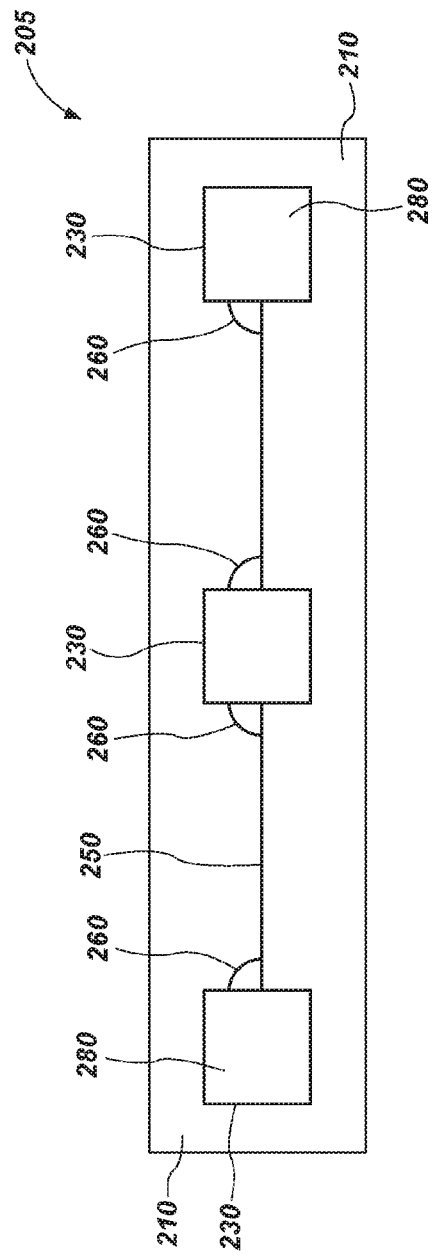

MOBILE ELECTRONIC DEVICE COVERING

TECHNICAL FIELD

The present technology relates to cases or covers for electronic devices. More specifically, the technology relates to lighting devices for cases or covers used in connection with a portable electronic device, such as a smart phone.

BACKGROUND

The present invention relates generally to Light Emitting Diode (LED) lighting components, lamps, and luminaries which can be used as light sources in various lighting applications and specifically in connection with cases for mobile electronic devices. For purposes of providing functional lighting, many electronic devices have lights (LED or otherwise) disposed about one end of the device which may be used to illuminate a subject to photograph or to provide illumination for other activities. In many instances, however, the brightness of the lights associated with the electronic device is limited. For example, in many LED lighting applications, several high power LEDs are placed in close configuration, such as flashlights, headlights and the like. The heat generating components, their power supplies, the PCBs, the thermal interface materials, and the fixing structures dictate the achievable performance level in the lighting application.

Mobile electronic cases are generally used to fit onto the mobile electronic device for protection and personalized decoration. The main function of a mobile phone case is to protect the surface of the mobile phone from frequent frictions and scratches and to withstand slight impacts. Apart from the single function of protection, some mobile phone cases provide additional alterations to offer functions of standing or hooking, etc. There is a lack, however, of mobile electronic cases or covers that include a separate lighting source that is not directly connected to the mobile electronic device.

SUMMARY OF THE INVENTION

In light of the problems and deficiencies inherent in the prior art, the present invention seeks to overcome these by providing methods, devices, and systems for providing a light source within a mobile electronic protective case. Aspects of the technology disclosed herein reside generally in a protective covering configured for use with a mobile electronic device and housing a mobile electronic device. In one aspect of the technology, the covering comprises a front wall and a plurality of side walls defining a primary cavity and a back wall disposed within the primary cavity, separating the primary cavity into a protective covering electronics housing cavity and a mobile electronic device housing cavity. One or more apertures are disposed within the front wall and a light source is disposed within the protective covering electronics housing cavity. At least a portion of the light source is disposed outside of the protective covering electronics housing cavity and through at least one of the one or more apertures in the front wall. A power supply is disposed within the protective covering electronics housing cavity and coupled to the light source. A heat sink is disposed within the protective covering electronics housing cavity and in contact, directly or indirectly, with the light source. At least a portion of the heat sink is disposed outside of the protective covering electronics housing cavity and through at least one of the one or more apertures in the front wall. In one aspect, a plurality of indentations are disposed within the front wall corresponding at least to the area occupied by a planar heat conductive material disposed directly behind the light source.

BRIEF DESCRIPTION OF THE DRAWINGS

The present technology will become more fully apparent from the following description and appended claims, taken in conjunction with the accompanying drawings. Understanding that these drawings merely depict exemplary aspects of the present technology they are, therefore, not to be considered limiting of its scope. It will be readily appreciated that the components of the present technology, as generally described and illustrated in the figures herein, could be arranged and designed in a wide variety of different configurations. Nonetheless, the technology will be described and explained with additional specificity and detail through the use of the accompanying drawings in which:

FIG. 11a is a side view illustrating one aspect of a flexible COB LED array in accordance with one aspect of the technology;

FIG. 11b is a top view of FIG. 11a;

DETAILED DESCRIPTION OF EXEMPLARY ASPECTS OF THE TECHNOLOGY

Figure 1:
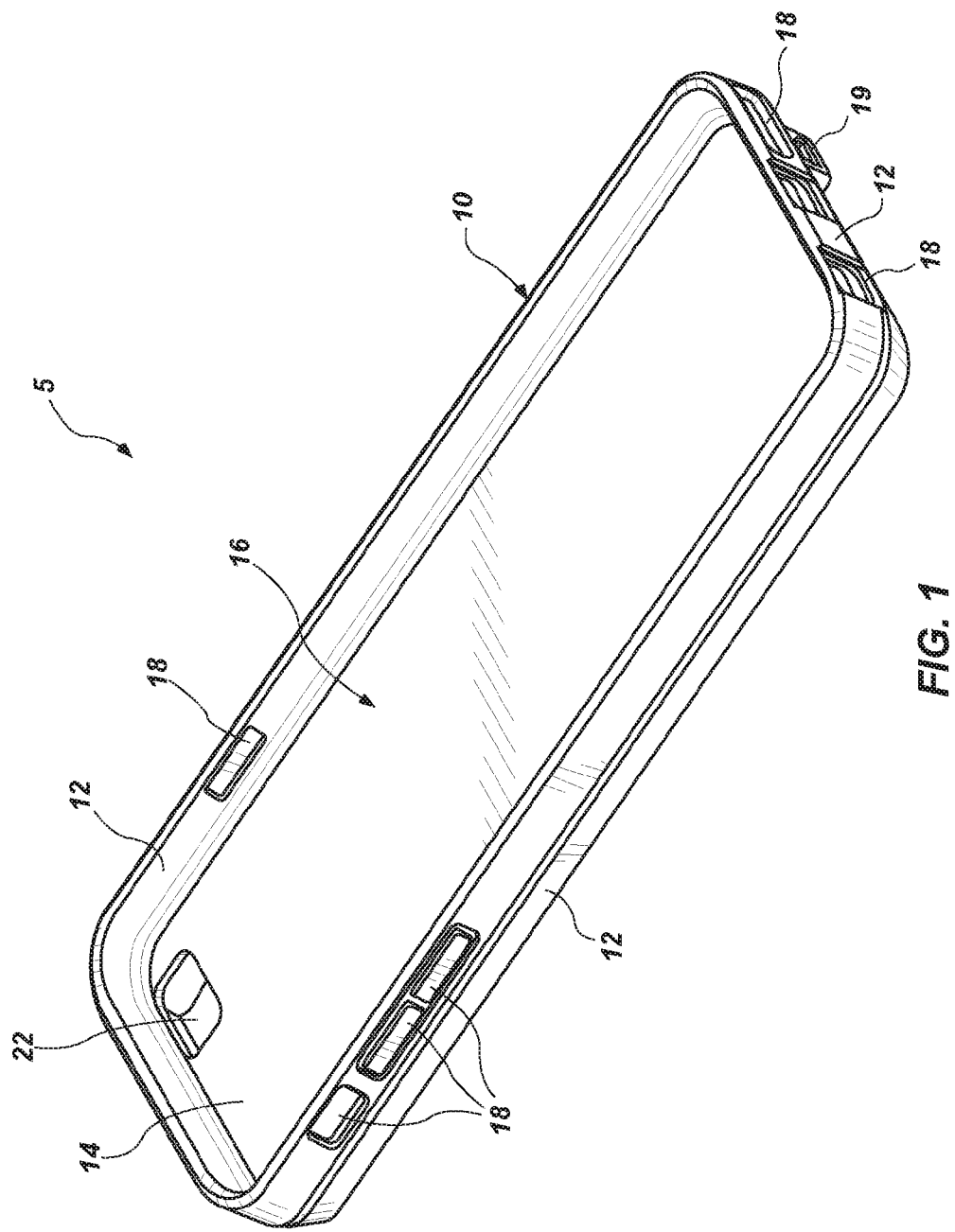
FIG. 1 is a perspective view of a back side of a mobile electronic device case in accordance with one aspect of the technology.
Figure 2:
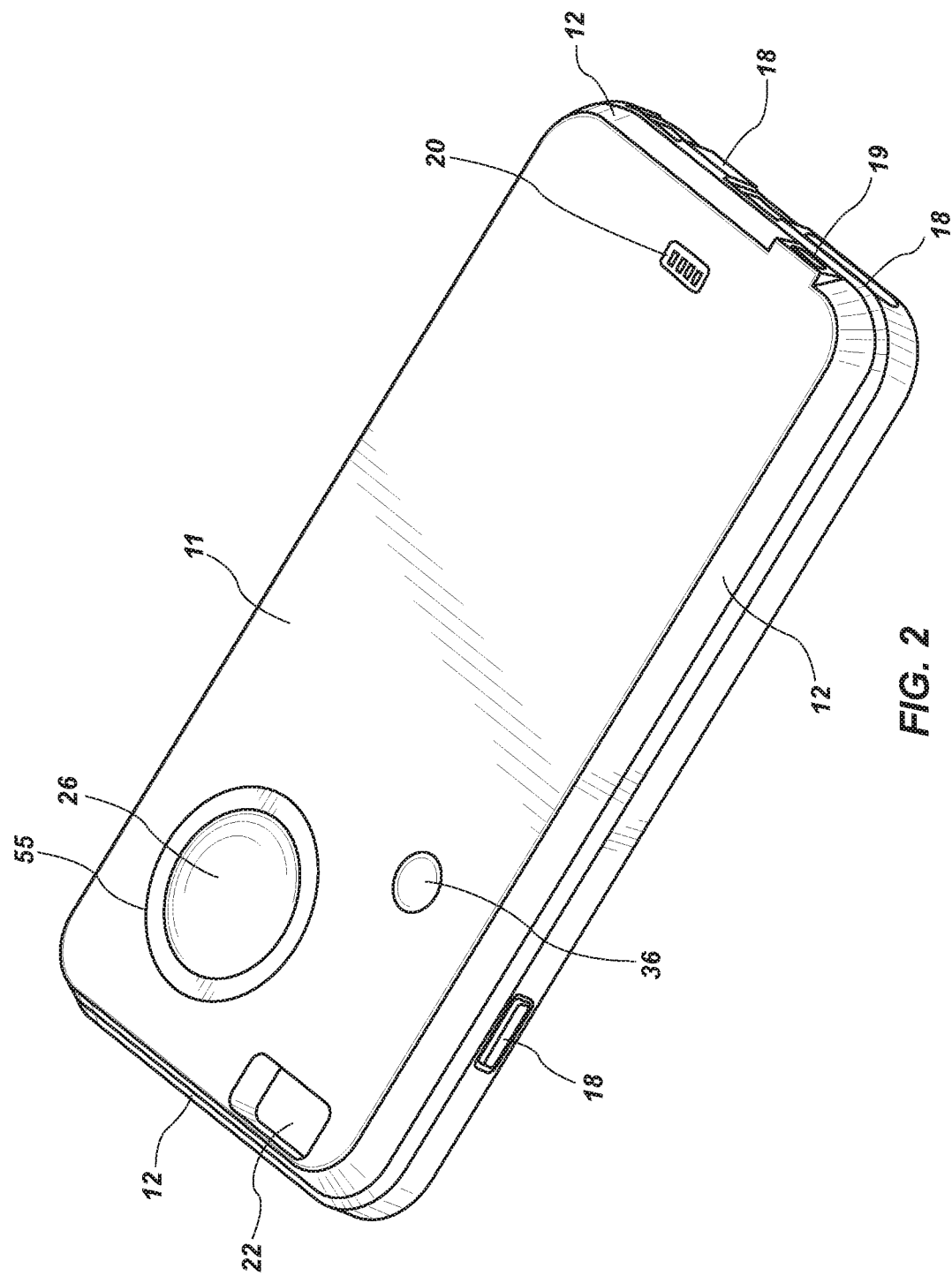
FIG. 2 is a perspective view of a front side of the mobile electronic device of FIG. 1 in accordance with one aspect of the technology.
Figure 3:
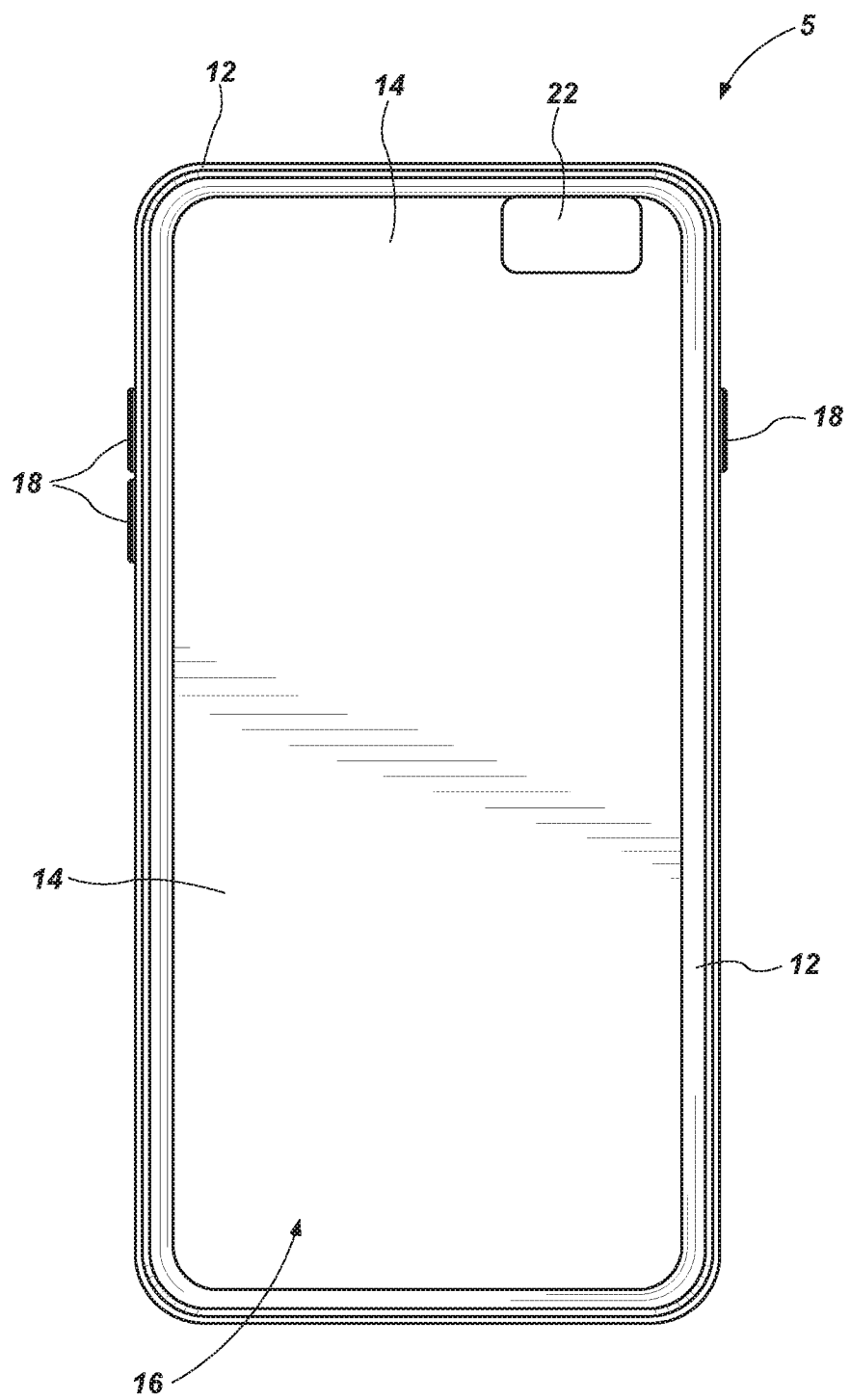
FIG. 3 is a front view of the mobile electronic device of FIG. 1.

Although the following detailed description contains many specifics for the purpose of illustration, a person of ordinary skill in the art will appreciate that many variations and alterations to the following details can be made and are considered to be included herein. Accordingly, the following aspects of the technology are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms."

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Reference in this specification may be made to devices, structures, systems, or methods that provide "improved" performance. It is to be understood that unless otherwise stated, such "improvement" is a measure of a benefit obtained based on a comparison to devices, structures, systems or methods in the prior art. Furthermore, it is to be understood that the degree of improved performance may vary between disclosed embodiments and that no equality or consistency in the amount, degree, or realization of improved performance is to be assumed as universally applicable.

An initial overview of the technology is provided below and specific technology embodiments are then described in further detail. This initial summary is intended to aid readers in understanding the technology more quickly, but is not intended to identify key or essential features of the technology, nor is it intended to limit the scope of the claimed subject matter. Broadly speaking, aspects of the current technology comprise a case configured to house a mobile electronic device, such as a tablet, cellular phone, GPS, laptop computer, etc. The case comprises a front wall with side walls and a back wall defining a cavity between the walls of the case. A light source (e.g., a light emitting diode or LED, etc.), battery, power switch, and heat sink are disposed, at least partially, within the cavity. In one aspect, at least a portion of the heat sink structure is positioned outside the cavity and exposed to the surrounding air. In another aspect, a portion of the front wall of the case is thinned to promote heat conduction outside of the cavity. In particular, the front wall of the case proximate to the heat sink structure within the cavity is thinned.

With reference generally to FIGS. 1 through 5, a case 5 having an outer shell 10 is disclosed. The outer shell 10 comprises a front wall 11 and side walls 12 defining a cavity 13 therein. A back wall 14 of the case 5 is disposed within the cavity 13 separating the cavity 13 into (i) a case or covering electronics cavity 15 configured to house lighting-related electronics, and (ii) a mobile electronics device cavity 16 configured to house a mobile electronic device therein. In one aspect of the technology, the front wall 11 and side walls 12 are integrally formed though they may be separately manufactured (from the same or different materials) and fit together at a later time as suits a particular construction application.

The side walls 12 of the case 5 comprise a plurality of side wall apertures 18 that create portals to access functional aspects of the mobile electronic device to be housed therein. For example, the side wall apertures 18 may provide access to a power switch, volume controls, headphone jacks, etc. associated with the mobile electronic device. The side wall apertures 18 are disposed in the side walls 12 in a location that corresponds to the mobile electronics device cavity 16. A single side wall aperture 19 is located in side wall 12 near a bottom of the case 5 and is disposed in a location that corresponds to the case 5 or protective covering electronics cavity 15 configured to house lighting-related electronics. The single side wall aperture 19 creates a portal to provide access for a power source to be coupled to a rechargeable battery located within the protective covering electronics cavity 15. A battery charge indicator 20 is disposed about the front wall 11 of the outer shell 10.

The front wall 11 of the outer shell 10 comprises a plurality of apertures 22. One of the apertures 22 passes through the front wall 11 and the back wall 14 as well as the protective covering electronics cavity 15 that lies between the front wall 11 and the back wall 14. In one aspect, this pass-through aperture 22 is located in a position that corresponds to a light, camera, or other functional attribute of the mobile electronic device that would otherwise be blocked by the case 5. Of course, one or more pass-through apertures 22 may be disposed in the case 5 as suits a particular application. In one aspect of the technology, a case light aperture 25 is disposed within the front wall 11 and is configured to permit a light source 26 (e.g., an LED, etc.) to be positioned about the case 5. A power switch aperture 35 is also disposed in the front wall 11 and is configured to permit placement of a power switch 36 within the case 5. The power switch 36 is operatively coupled to a battery 40 and the light source 26 and acts to control the flow of power from the battery 40 to the light source 26.

In one aspect of the technology, the light source 26 comprises a COB LED (chip on board light emitting diode) 27. The COB LED 27 comprises a plurality of microchips disposed on a substrate 28. The microchips are powered by the battery 40 and generate light as is known in the art. The COB LED 27 is mounted on a heat sink 50 comprising a thermally conductive material. The heat sink 50 is a passive heat exchanger that transfers the heat generated by the COB LED 27 into a coolant fluid in motion. In one aspect, the coolant fluid in motion is air inside the protective covering electronics cavity 15 as well as air outside of the device. In one aspect of the technology, the heat sink 50 comprises a flat planar metallic component 51 that occupies an area behind the substrate 28 as well as open space in approximately the top one-third of the protective covering electronics cavity 15. While the figures illustrate placement of the light source 26 and corresponding heat sink 50 in the top of the protective covering electronics cavity 15, it is understood that the light source 26 and heat sink 50 may be located in the middle or bottom of the cavity 15 without departing from the essence of the technological innovation here.

In one aspect of the technology, the planar heat sink component 51 comprises an aluminum alloy, copper alloy, or other material known in the art. In one aspect of the technology, the back side 52 of the planar heat sink component 51 is coated with a thermally insulating material in an effort to dissipate heat through the top and edges of the planar component 51 rather than the back side 52 of the heat sink component 51. In one aspect, the thermally insulating material includes plastics, polyamides, polyurethanes, polystyrenes, other polymers, elastomers, and the like. In accordance with one aspect of the technology, the heat sink 50 further comprises a thermally conductive frame 55. The frame 55 is configured to approximate the shape of the LED 26 and is configured to position the LED 26 in aperture 25. The frame 55 is in contact with the planar heat sink component 51. When mounted in aperture 25, an outer portion of the frame 55 surrounds the perimeter of the light source 26 (e.g., the LED) and is exposed to the air outside of the case 5. In this manner, heat generated from the light source 26 is conducted away from the light source 26. In one aspect of the technology, the frame 55 comprises an aluminum alloy, copper alloy, or other thermally conductive material known in the art. A mounting ring 56 is disposed between the frame 55 and the light source 26 to further help secure the frame 55 onto the front wall 11 and position the light source 26 within aperture 25. The frame 55 and mounting ring 56 may be circular or may be some other shape to approximate the perimeter of the light source 26. With specific reference to FIG. 13, in one aspect of the technology, a top surface (i.e., the surface disposed outside of cavity 15) of the frame 55 comprises a plurality of concentric channels 57 circumscribing the light source 26.

In this aspect, no mounting ring 56 is used and the frame 55 is positioned in direct contact with the light source 26 as well as the planar heat sink component 51, though it is understood that a mounting ring 56 could be used so long as the frame 55 is in contact with the planar heat sink component 51. It is understood that thermal adhesives and greases may be used in connection with the technology described herein as is known in the art and the use of a small amount of thermal adhesive or grease between the frame 55 and the planar heat sink component 51 (or other components discussed herein) or the frame 55 and the light source 26 would still be considered to be "directly in contact" with an adjacent component. Moreover, the light source 26 should be read broadly to include any heat producing element of the light source 26, including, but without limitation, the substrate 28 on which LEDs 27 are mounted in an LED light source application.

Figure 4:
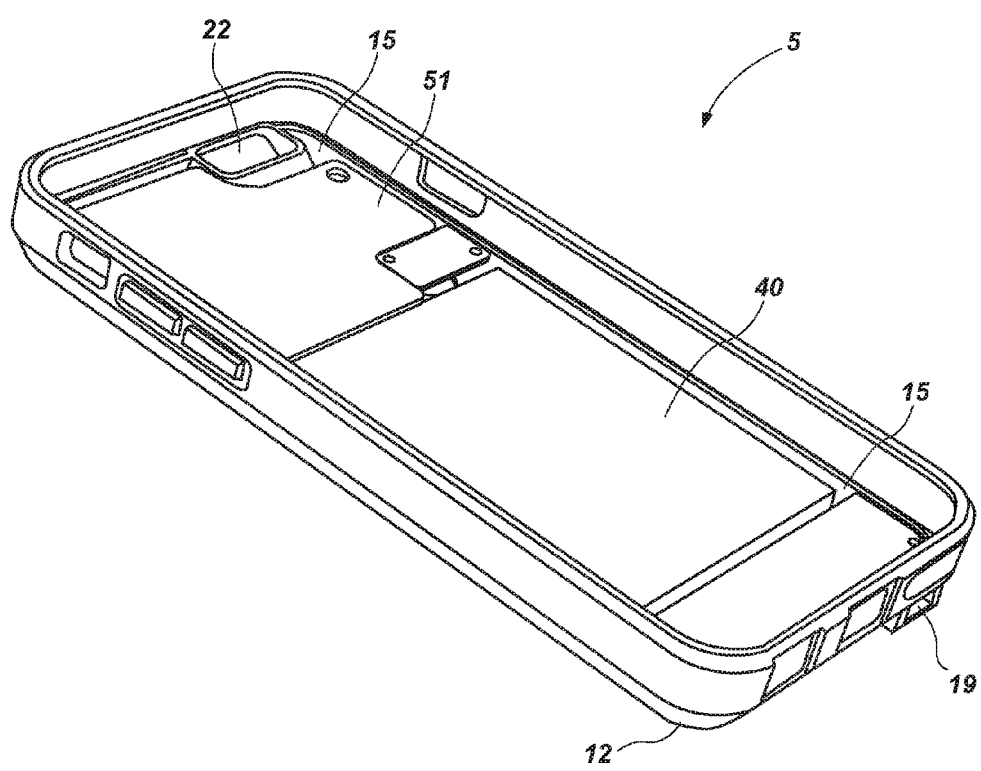
FIG. 4 is a perspective view of a back side of the mobile electronic device case of FIG. 1 with a back wall of the case removed.
Figure 5:
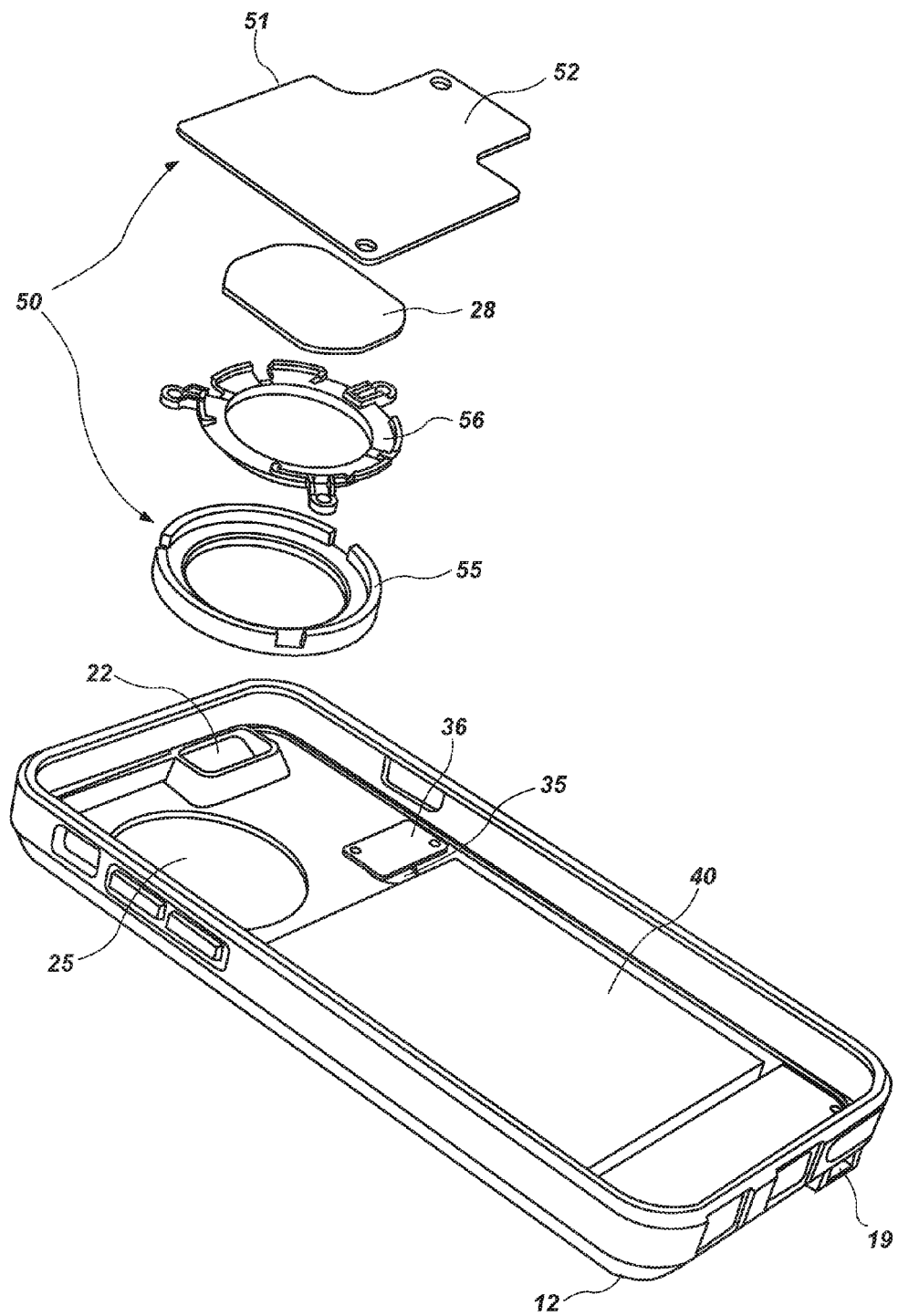
FIG. 5 is a partially exploded view of FIG. 4.
Figure 6:
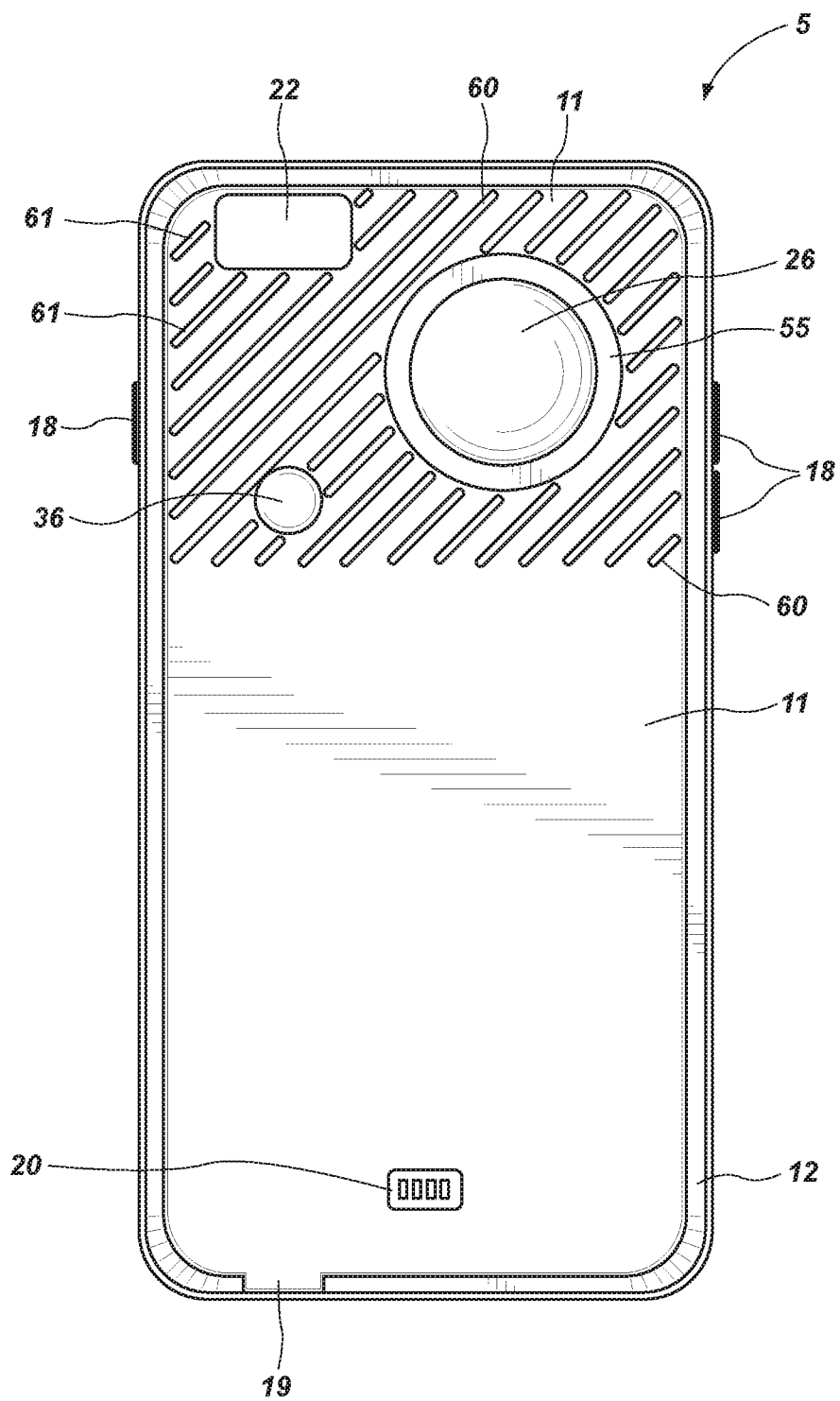
FIG. 6 is a front view of a mobile electronic device case in accordance with one aspect of the technology.
Figure 7:
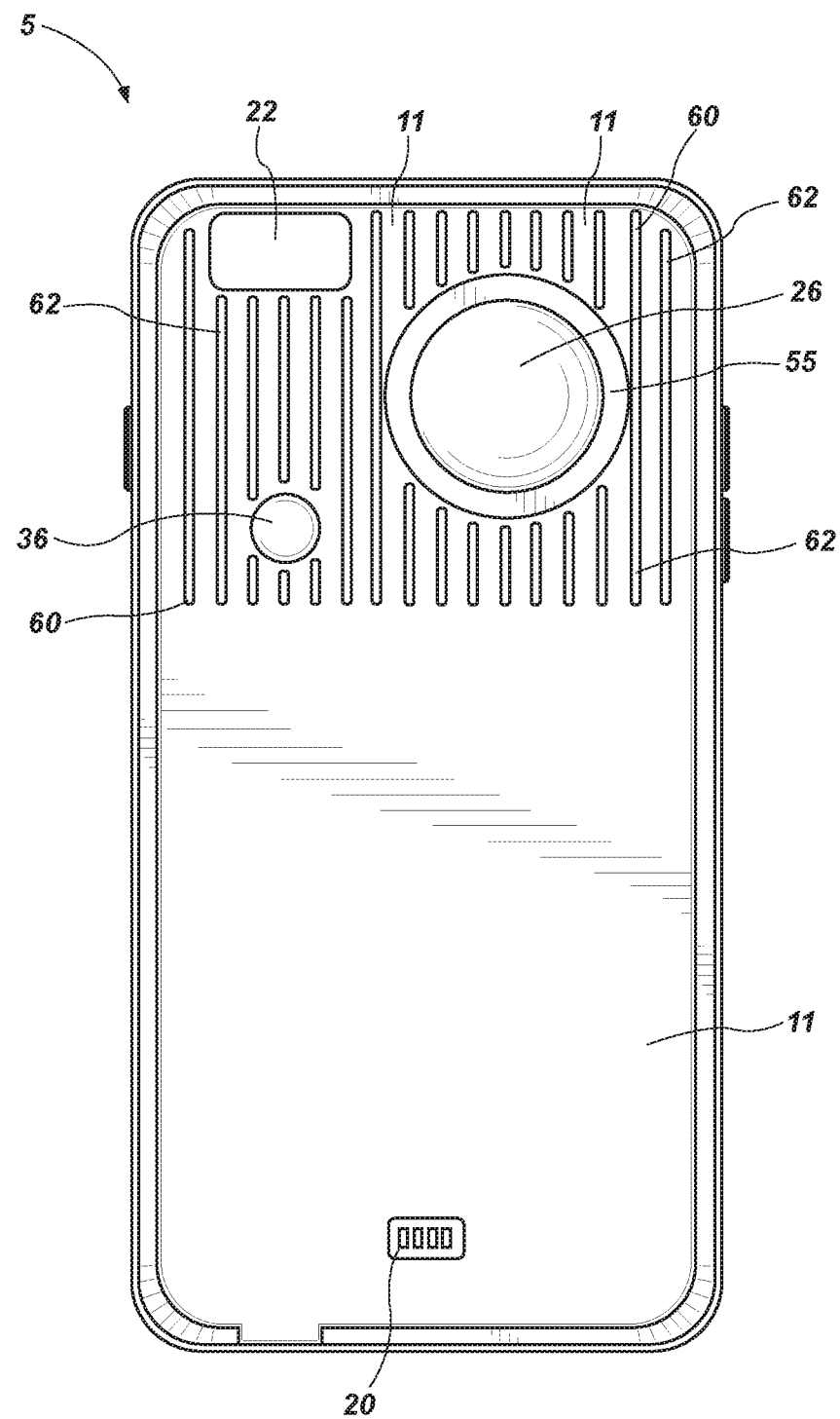
FIG. 7 is a front view of a mobile electronic device case in accordance with one aspect of the technology.
Figure 8:
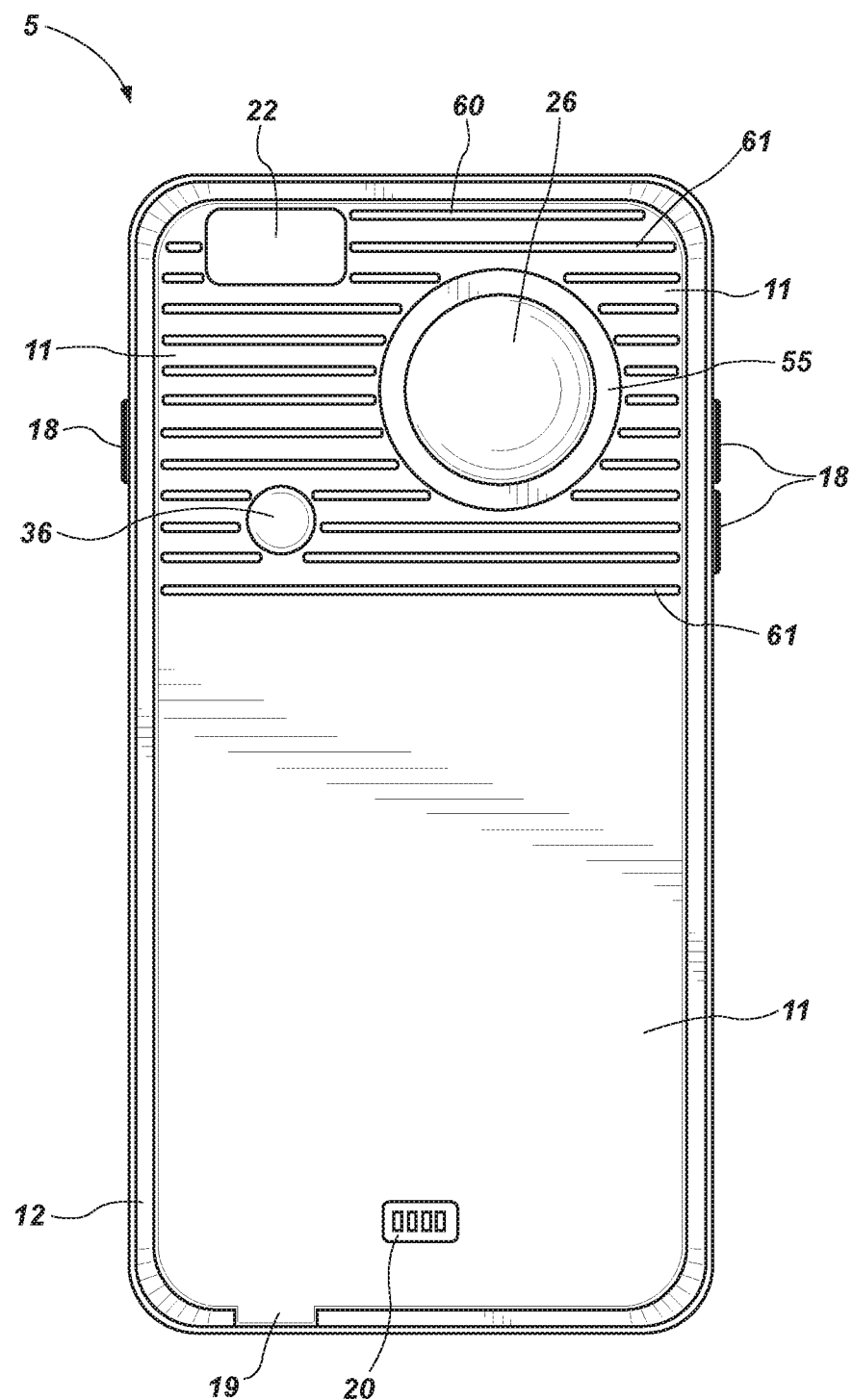
FIG. 8 is a front view of a mobile electronic device case in accordance with one aspect of the technology.

With reference generally to FIGS. 4 and 5 and more specific reference to FIGS. 6 through 9, a plurality of indentations 60 are disposed in the front wall 11 of case 5. The indentations 60 are disposed at least over the same area of the front wall 11 that corresponds to the location of the planar heat sink component 51 though they may be disposed over the entire front wall 11. In one aspect, the indentations 60 result in a thinned portion of the front wall 11 that more easily conducts heat away from the cavity 15. FIGS. 6 through 8 illustrate an aspect where the indentations 60 comprise linear channels 61. The linear channels 61 may be oriented in numerous different directions as suits a particular application, including vertical, horizontal, or angled. Moreover, in one aspect of the technology, the linear channels 61 may extend across the front wall 11 having an open end at the intersection of the front wall 11 with the side wall 12. The open end promotes heat dissipation laterally away from the front wall 11. While linear channels 61 are shown on the figures, the indentations 60 may also be configured in non-linear channels, circles, squares, or any other number of shapes as suits a particular application.

Figure 9:
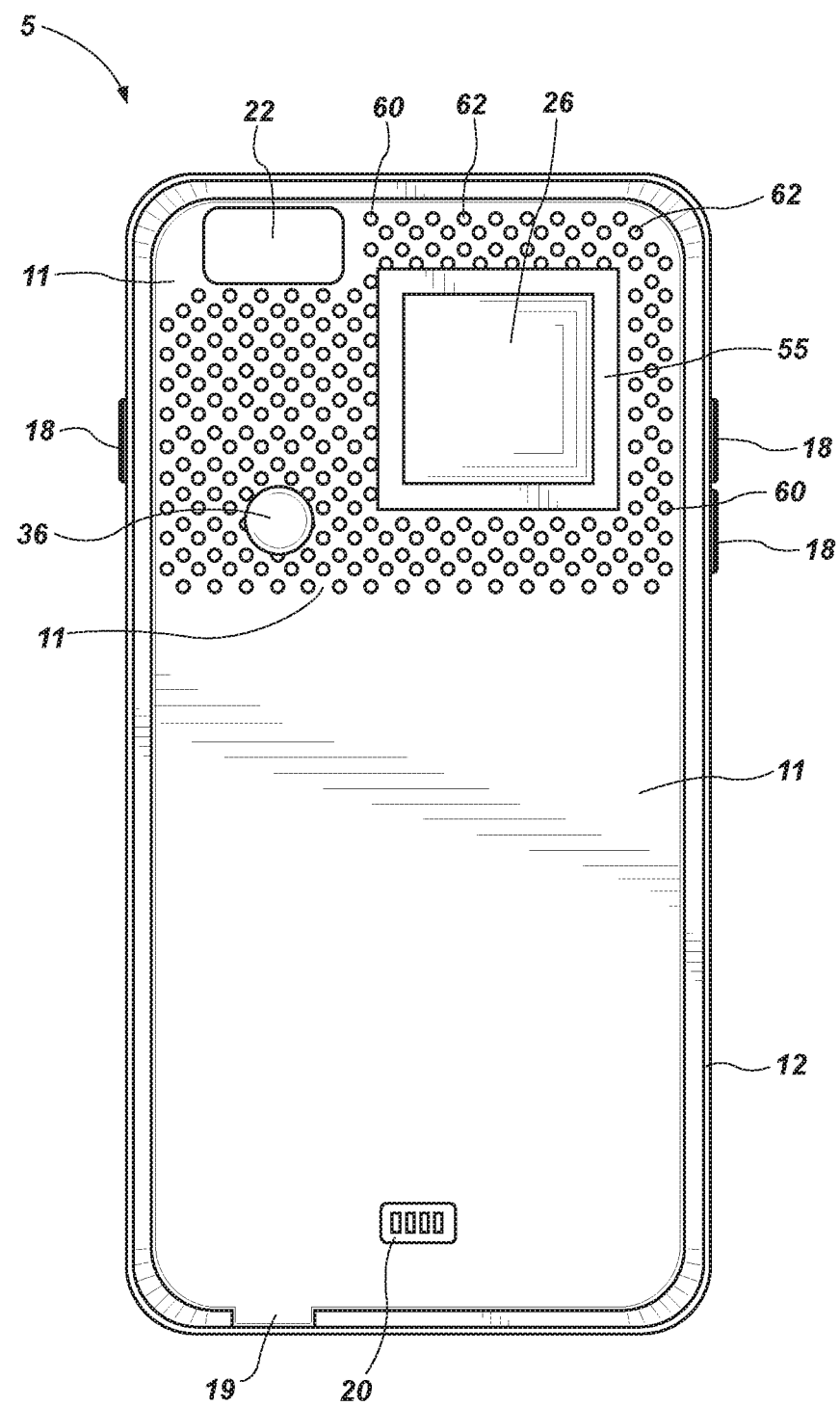
FIG. 9 is a front view of a mobile electronic device case in accordance with one aspect of the technology.
Figure 10:
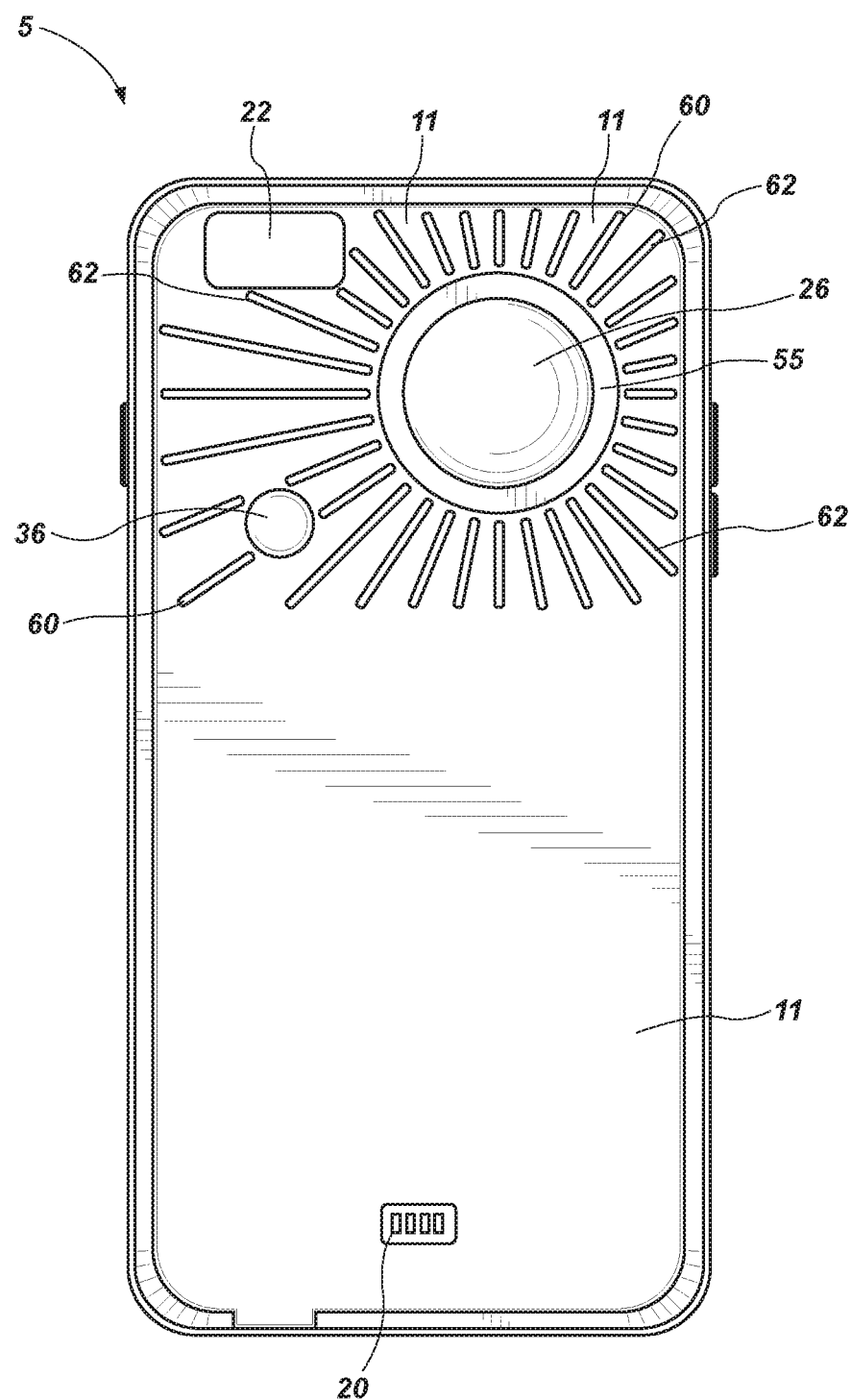
FIG. 10 is a perspective view of a mobile electronic device in accordance with one aspect of the technology.
Figure 12:
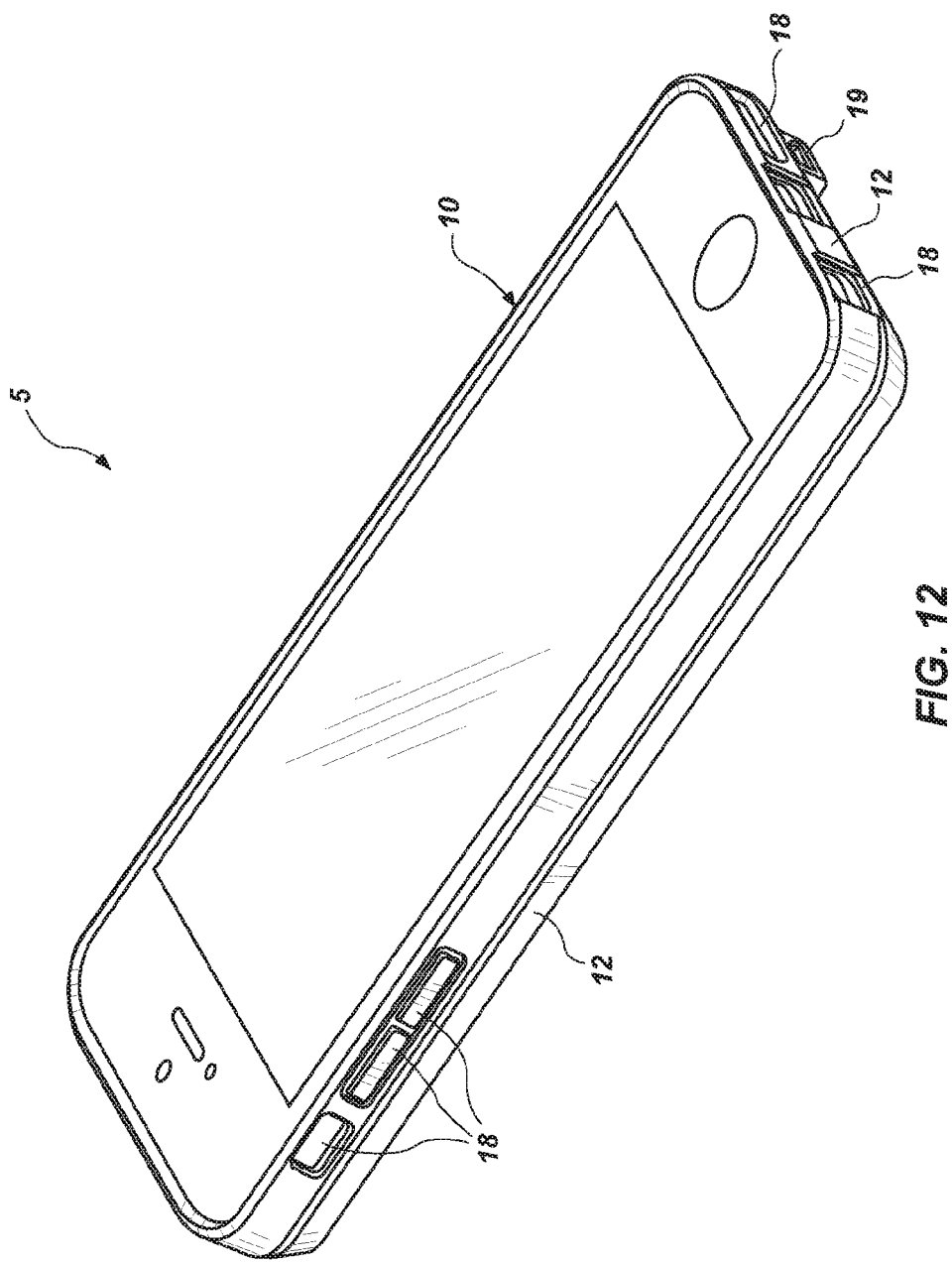
FIG. 12 is a perspective view of a mobile electronic device case and corresponding mobile electronic device in accordance with one aspect of the technology.

FIG. 9 illustrates an aspect where the indentations 60 comprise circular indentations 62. As with the linear channels 61, the circular indentations 62 are disposed about the area of the front wall 11 that corresponds to the area where the planar heat sink component 51 resides within cavity 15 though the circular indentations 62 may be disposed about the entire surface of front wall 11. In one aspect of the technology, the indentations 60 (linear, circular, or otherwise) may be located about the side walls 12 of the case 5 to further promote dissipation of heat away from the cavity 15. In another aspect of the technology the thickness of the front wall 11 relative to the "thinned" areas within indentations 60 is approximately less than 2 to 1. That is, the "thinned" areas within the indentations 60 are less than approximately half the thickness of the front wall 11 adjacent the indentations 60.

Figure 13:
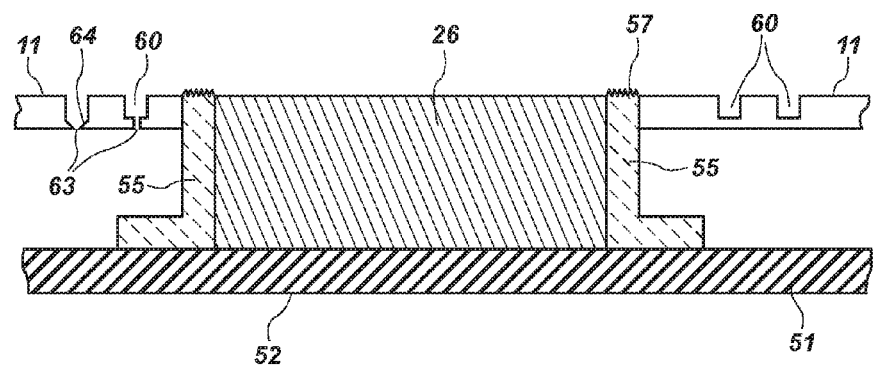
FIG. 13 is a cross sectional side view of a portion of a mobile electronic device in accordance with one aspect of the technology.
Figure 14:
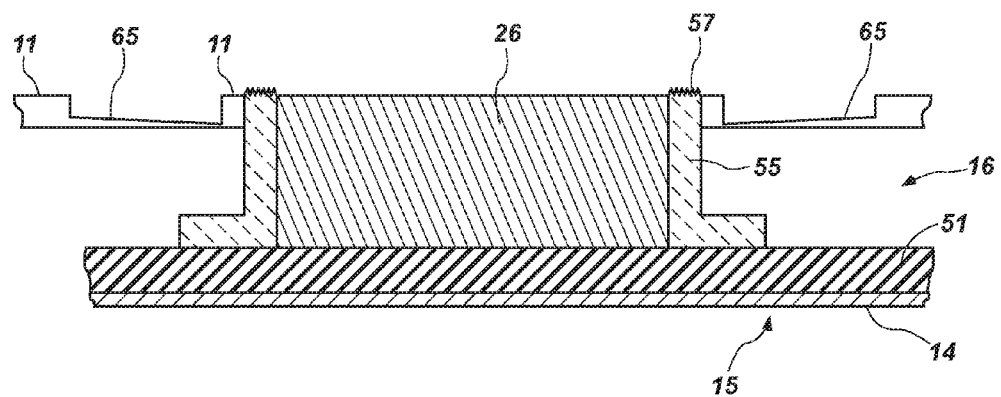
FIG. 14 is a cross sectional side view of a portion of a mobile electronic device in accordance with one aspect of the technology.

With reference to FIG. 13, in accordance with one aspect of the technology, the indentations 60 comprise an aperture 63 that passes through the bottom of the indentation 60 and into the cavity 15. In one aspect, the top cross sectional area of the aperture 63 is less than half the top cross sectional area of the indentation 60 and, in one aspect, is less than ten percent of the top cross sectional area of the indentation 60. However, in another aspect of the technology, the aperture 63 is substantially equal to the indentation 60 but is filled with a material (e.g., a thermally conductive polymer or aluminum alloy) that has a thermal coefficient of conductivity that is greater than the conductivity of the material comprising the outer shell 10. In one aspect, the outer shell 10 comprises a material having a thermal coefficient less than 1 and the filler material placed within the aperture has a thermal coefficient of conductivity greater than 1. In accordance with one aspect of the technology, a bottom portion 64 of the indentation 60 comprises opposing sloped walls. It is believed that the sloped walls assist in the dynamics associated with dissipation of heat. In like manner, in accordance with one aspect of the technology and with reference to FIG. 14, the indentations 60 may comprise linear channels 61 with a sloped bottom 65 that slopes upward as the channel 61 extends away from the light source 26. It is believed that the heat gradient is greater near the light source 26 and frame 55. The sloped bottom 65 allows for construction of a significantly thin bottom near the greatest amount of heat while maintaining structure integrity of the front wall 11 nearer the side walls 12.

In accordance with one aspect of the technology, the outer shell 10 of the case 5 is constructed of one or more of a polycarbonate, rubber, plastic, silicone, carbon fiber, or metal material. In one aspect, the outer shell 10 comprises a rigid frame and a semi or non-rigid covering though the entire cover may be primarily rigid or primarily semi or non-rigid as suits a particular application. In one aspect of the technology, the material used to construct the outer shell 10 comprises a material that promotes additional removal of heat from the device. Heat transfer has three modes: conduction; convection; and radiation. Only the conduction mode is dependent on material conductivity. Heat often moves through a material faster than it can be removed from its surface. Thermally conductive synthetic materials (e.g., plastics, polycarbonates, etc.) can transfer heat like metals and ceramics. A non-linear relationship generally exists between heat transfer and material thermal conductivity. For example, one can image a block of material with a thickness of ½ inch. 5 Watts of power are input on one side of the sample and the heat is carried away on the opposing side with a fan. The heat transfer is represented by the sum of the temperature differentials and can be calculated as a function of the material thermal conductivity. In one aspect of the technology, the outer shell 10 is formed, at least in part, of a thermally conductive polymer. The term "thermally conductive polymer," means a polymer having a thermal conductivity, measured in watts/meter ° K (W/m ° K) of at least 1.0, measured according to ASTM E1461 and F433. Preferred polymers generally have a thermal conductivity of at least 1.0 W/m ° K, at least 1.5 W/m ° K, or at least 3.0 W/m ° K. Suitable thermally conductive polymers include thermally conductive polypropylene, thermally conductive elastomer, thermally conductive liquid crystalline polymer, thermally conductive nylon, thermally conductive polycarbonate, thermally conductive PC/ABS blend, and thermally conductive PPS. Other suitable thermally conductive polymers include polymers containing metal or ceramic fillers in a sufficient quantity to provide the desired level of thermal conductivity.

Aspects of the current technology utilize the manufacture of chip onboard (COB) LEDs on a flexible substrate, though flexible COB LEDs are not required. In one aspect of the technology, the flexible COB LED is manufactured using a first fixture to hold a flexible substrate in place and provide general location reference targets for aligning chip placement, wire bonding, and gel dipping. The flexible substrate comprises conductive trace pads thereon. An adhesive is placed on the flexible substrate followed by placement of LED chips (or dies) onto the flexible substrate. This assembly is then heated for curing. The leads of the LED dies are then wire bonded to the conductive trace pads on the flexible substrate. A second fixture is used to hold the flexible substrate and bonded die sub-assembly in place while a first coating of silicone or other protective material is deposited on the LED dies. This sub-assembly is then heated for curing. A third fixture may be used and is placed over the sub-assembly that holds the sub-assembly immobile and provides a flow dam as silicone gel is flooded over the LED array, followed again by a third heating step. The gel flooding may also be performed in some cases without the need for the third fixture. The resulting flexible COB LED array can then be used in any number of applications (e.g., spotlights, hand-held flashlights, headlamps, bicycle lighting, etc.) where an array having a planar geometry is applied to a non-planar surface to provide a light source. In another method for fabrication, the dies are fixed to the flexible substrate, cured, wire bonded, cured again, selective coating of silicone covering the dies and wire bonds and curing in the same fashion as described above. This assembly is then mounted with thermally conductive adhesive to a pre-shaped aluminum structure of desired shape and inserted into a transparent or translucent plastic housing. A final silicone-phosphor coating is injected into the intended space between the outer wall of the transparent/translucent housing and the light emitting surface of the flexible COB LED assembly, filling the space. In an optional aspect, the housing is pre-loaded with a quantity of silicone-phosphor coating before the flexible COB LED assembly is placed within the housing. Any remaining space is then filed with additional silicone-phosphor material. In one aspect, the assembly is then placed into a vacuum chamber to remove unwanted bubbles that may be present in the coating material. The entire assembly is again cured. The resulting non-planar COB LED assembly is used as a drop-in module into a final lighting product. Additional information with respect to the flexible COB LED may be found in U.S. Application No. 62/151,559 which is incorporated herein in its entirety by reference.

In accordance with one aspect of the technology, FIGS. 11a and 11b illustrate a COB LED structure 205. The COB LED structure 205 generally includes a flexible substrate 210, an LED chip 230, a thermally conductive binding layer 240, a circuit layer 250, a plurality of electrical connection lines 260, a binder (e.g., clear epoxy or fluorescent adhesive) 280 and a package coating 290. In accordance with one aspect of the technology, the flexible substrate 210 comprises a flexible printed circuit board (PCB) made of a flexible polymer. The description in this paragraph, as well as others, is exemplary of one aspect of the technology. It is understood, that not all of the above-referenced components are required in a COB LED structure used with the present technology. Other components may be used as suits a particular application.

Broadly speaking, a flexible PCB is an array of conductors bonded to a thin dielectric film. In one aspect of the technology, a single-sided flexible substrate 210 is employed and comprises a single conductor layer made of either a metal or conductive (metal filled) polymer on a flexible dielectric film and component termination (or connection) features are accessible only from one side. Holes may be formed in the base film to allow component leads to pass through for interconnection by soldering, for example. In another aspect, double access flex, also known as back bared flex are employed. These circuits are flexible circuits having a single conductor layer that is processed so as to allow access to selected features of the conductor pattern from both sides. In another aspect of the technology, a double sided flexible PCB is employed. Double-sided flex circuits are flex circuits having two conductor layers. These flex circuits can be fabricated with or without plated through holes. Because of the plated through hole, terminations for electronic components are provided for on both sides of the circuit, thus allowing components to be placed on either side. In yet another aspect of the technology, a polymer thick film (PTF) circuit is employed. PTF is a printed circuit having conductors printed onto a polymer base film. The PTF is a single conductor layer structure.

In one aspect of the technology, the base material of the flexible polymer film which provides the foundation for a substrate ranges from approximately 12 µm to 125 µm (½ mil to 5 mils) but thinner and thicker materials are possible for use herein. Thinner materials are more flexible and for most material, stiffness increase is proportional to the cube of thickness. Non-limiting examples of different materials used as base films including: polyester (PET), polyimide (PI), polyethylene napthalate (PEN), Polyetherimide (PEI), along with various fluropolymers (FEP) and copolymers polyimide films. Adhesives are used as the bonding medium to create the substrate. In an additional aspect, a metal foil is used as the conductive element of the flexible substrate. The metal foil is the material from which the circuit paths are etched. A wide variety of metal foils of varying thickness are known in the art. In one aspect of the technology, stiffening members (e.g., small diameter wires) are placed about the back side of the flexible substrate to increase the stiffness of the flexible substrate but continue to permit the substrate to be malleable. Advantageously, the stiffening members help maintain the flexible substrate in a selected configuration. For example, if the flexible substrate is bent into an arc shape, the stiffening members help keep the flexible substrate in the arc shape. This feature minimizes the likelihood that the bond between the flexible substrate and an underlying heat sink will be disturbed.

In accordance with one aspect of the technology, the LED chip 230 comprises a sapphire substrate and includes at least an N type semiconductor layer, a semiconductor light emitting layer and a P type semiconductor layer, which are sequentially stacked. In one aspect, the N type semiconductor layer is an N type GaN (gallium nitride) layer, the semiconductor light emitting layer may consist of gallium nitride or indium gallium nitride, and the P type semiconductor layer is a P type GaN layer. Further, the P type semiconductor layer and the N type semiconductor layer are respectively connected to a positive end and a negative end of an external power source by at least one electrical connection line. The thermally conductive binding layer 240 is used to bind the LED chip 230 to the flexible polymer substrate. In general, the thermally conductive binding layer 240 consists of silver paste, tin paste, copper-tin alloy or gold-tin alloy. The circuit layer 250 is formed on the flexible substrate 210 and includes a circuit pattern. The electrical connection lines 260 are used to connect the LED chip 230 to the circuit layer 250. That is, the positive and negative ends of the LED chip 230 are respectively connected to the positive and negative terminals of the circuit layer 250 so as to supply power to the LED chip 230 and turn on the LED chip 230.

In one aspect, the fluorescent binder or coating 280 is deposited on the LED chip 230 to provide the effect of fluorescence. More specifically, the fluorescent binder 280 can convert the original light generated by the LED chip 230 into the output light within the spectrum of visible light with a specific wavelength. For example, the original light with the spectrum of ultraviolet is converted into substantially blue (425 to 450 nm) or substantially red (650 to 700 nm)

light. The package coating 290 is transparent, providing electrical insulation to enclose the circuit layer 250, the electrical connection lines 260 and the fluorescent binder 280. In one aspect, the package coating 290 comprises silicone gel or epoxy resin or other materials known in the art.

In another aspect of the technology, a transparent assembly cap 295 is disposed atop a plurality of LED chips 230 configured on a single flexible COB LED. In lieu of (or in addition to, depending on a particular application) a fluorescent coating 296, such as a phosphor coating, is deposited about the interior of the assembly cap 295. The single fluorescent coating 296 disposed about the assembly cap 295 covering a plurality of LED chips 230 results in a uniform light pattern emanating from the entire array. Advantageously, when disposed in a non-planar fashion, the result is a high-powered, compact, light source distributed over a non-planar area. In contrast to a non-COB LED array, the flexible COB LED (or FCOB LED) array of the present technology provides high-power, uniform lighting options producing an output typically greater than 150 lumens.

In accordance with one aspect of the technology, a flexible COB LED is used as the light source 26 in connection with the case 5. In this aspect, the light source 26 extends from a side wall 12 of the case 5, across the front wall 11 of the case 5 and onto an opposing side wall 12. In this manner, a single light source 26 in the form of a single flexible COB LED arrangement (e.g., LED's disposed on a single substrate) is disposed about the case 5 and provides light in both forward and lateral directions to the user. In this aspect, the planar heat sink component 51 is formed to approximate the shape of the single flexible COB LED arrangement and the frame 55 extends around the entire perimeter of the COB LED. The frame 55 may be rectilinear or curvilinear as suits a particular application. Importantly, the single COB LED and its attendant frame 55 extends from a first side wall across the front wall 11 of the case 5 and onto a second side wall, wherein the first side wall opposes the second side wall.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

The invention claimed is:

1. A protective covering configured for use with a mobile electronics device, comprising:
   a front wall and a plurality of side walls defining a primary cavity;
   a back wall disposed within the primary cavity separating the primary cavity into a protective covering electronics housing cavity and a mobile electronic device housing cavity;
   one or more apertures disposed within the front wall;
   a light source disposed within the protective covering electronics housing cavity, wherein at least a portion of the light source is disposed in at least one of the one or more apertures in the front wall;
   a power supply disposed within the protective covering electronics housing cavity and coupled to the light source;
   a heat sink disposed within the protective covering electronics housing cavity adjacent the light source, wherein at least a portion of the heat sink is disposed outside of the protective covering electronics housing cavity.

2. The protective covering of claim 1, wherein the heat sink comprises a planar thermally conductive material disposed directly behind the light source and across a portion of the protective covering electronics housing cavity.

3. The protective covering of claim 2, wherein the heat sink further comprises a frame disposed about a perimeter of the light source, wherein a top portion of the frame is disposed outside of the protective covering electronics housing cavity and through at least one of the one or more apertures in the front wall and a bottom portion of the frame is disposed in contact with the planar thermally conductive material.

4. The protective covering of claim 3, wherein the front wall comprises a first thickness and a second thickness.

5. The protective covering of claim 4, further comprising a plurality of channels disposed within the front wall corresponding at least to the area occupied by the planar thermally conductive material disposed directly behind the light source.

6. The protective covering of claim 4, further comprising a plurality of indentations disposed within the front wall corresponding at least to the area occupied by the planar heat conductive material disposed directly behind the light source.

7. The protective covering of claim 1, further comprising a power switch disposed within the protective covering electronics housing cavity, wherein at least a portion of the power switch is disposed outside of the protective covering electronics housing cavity and through at least one of the one or more apertures in the front wall.

8. The protective covering of claim 7, further comprising an aperture disposed through at least one sidewall of the protective covering, said sidewall aperture providing access to electronics that are operatively coupled to a power source.

9. The protective covering of claim 1, further comprising an aperture that extends through both the front and back walls of the protective covering.

10. A protective covering configured for use with a mobile electronic device, comprising:
    a front wall and a plurality of side walls defining a primary cavity;
    one or more apertures disposed within the front wall;
    a light source disposed within the primary cavity;
    a power supply disposed within the primary cavity and coupled to the light source;
    a heat sink disposed within the primary cavity and in contact with the light source, wherein the heat sink comprises a planar thermally conductive material disposed behind the light source and across a top portion of the primary cavity;
    a plurality of indentations disposed about an area of the front wall corresponding at least to a portion of the area occupied by the planar thermally conductive material disposed behind the light source.

11. The protective covering of claim 10, wherein the indentations are circular indentations.

12. The protective covering of claim 10, wherein the indentations are linear indentations forming channels within a top surface of the front wall.

13. The protective covering of claim 10, further comprising a thermally insulating coating disposed about a back side of the planar heat conductive material.

14. The protective covering of claim 13, wherein the planar thermally conductive material comprises a metallic plate configured to cover approximately one-third of the top of the protective covering electronics housing cavity.

15. The protective covering of claim 10, further comprising a plurality of apertures disposed within the indentations, the apertures extending from a top portion of the planar thermally conductive material to an area outside the protective covering electronics housing cavity.

16. The protective covering of claim 15, further comprising a thermally conductive polymer disposed within the apertures that are disposed within the indentations.

17. A mobile electronic device disposed within a protective covering containing a power supply and light source separate from the mobile electronic device, comprising:
- a mobile electronic device having a power source, a display, and a first light source;
- a protective covering having:
  - a front wall and a plurality of side walls defining a primary cavity, a back wall disposed within the primary cavity separating the primary cavity into a protective covering electronics housing cavity and a mobile electronic device housing cavity;
  - one or more apertures disposed within the front wall;
  - a second light source disposed within the protective covering electronics housing cavity, wherein at least a portion of the second light source is directed outside of the protective covering electronics housing cavity and through at least one of the one or more apertures in the front wall;
  - a power supply disposed within the protective covering electronics housing cavity and coupled to the light source; and
  - a heat sink disposed within the protective covering electronics housing cavity and adjacent to the light source, wherein the heat sink comprises a planar thermally conductive component disposed directly behind the second light source and across a portion of the protective covering electronics housing cavity, and wherein a portion of the heat sink is disposed outside the protective covering electronics housing cavity.

18. The apparatus of claim 17, wherein the heat sink further comprises a frame disposed about a perimeter of the light source, a portion of the frame being disposed outside the protective covering electronics housing cavity.

19. The apparatus of claim 18, wherein the light source comprises a flexible chip-on-board light-emitting-diode.

20. The apparatus of claim 19, wherein the light source is disposed about opposing sidewalls and about the front wall in a continuous LED strip.

* * * * *